United States Patent
Tan et al.

(10) Patent No.: US 8,334,694 B2
(45) Date of Patent: Dec. 18, 2012

(54) SYSTEM AND METHOD FOR EMBEDDED SELF-CALIBRATION WITHIN AN INVERSION RECOVERY PULSE SEQUENCE

(75) Inventors: Ek Tsoon Tan, Rochester, MN (US); Stephen J Riederer, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 443 days.

(21) Appl. No.: 12/690,756

(22) Filed: Jan. 20, 2010

(65) Prior Publication Data

US 2010/0182008 A1    Jul. 22, 2010

Related U.S. Application Data

(60) Provisional application No. 61/145,929, filed on Jan. 20, 2009.

(51) Int. Cl.
*G01V 3/00* (2006.01)
(52) U.S. Cl. .................................................. 324/309
(58) Field of Classification Search ........... 324/300–322
See application file for complete search history.

(56) References Cited

U.S. PATENT DOCUMENTS

| 4,742,303 | A  | * | 5/1988  | Bendall ...................... 324/309 |
| 4,885,542 | A  |   | 12/1989 | Yao et al. |
| 6,289,232 | B1 |   | 9/2001  | Jakob et al. |
| 6,714,010 | B2 |   | 3/2004  | Madore |
| 7,279,895 | B2 |   | 10/2007 | Wang et al. |
| 7,408,346 | B2 | * | 8/2008  | Szyperski et al. ............. 324/307 |
| 7,577,472 | B2 | * | 8/2009  | Li et al. ......................... 600/410 |
| 8,121,668 | B2 | * | 2/2012  | Sutton et al. .................. 600/419 |

OTHER PUBLICATIONS

Masahiro Takizawa et al; Parallel Imaging of Head With A Dedicated Multi-coil On A 0.4T Open MRI; Magnetic Resonance In Medicine Sciences, vol. 4, No. 2, p. 95-101, 2005.

* cited by examiner

*Primary Examiner* — Dixomara Vargas
(74) *Attorney, Agent, or Firm* — Quarles & Brady, LLP

(57) ABSTRACT

An improved self-calibration method for accelerated magnetic resonance imaging (MRI) using inversion recovery pulse sequences allows calibration data for determining coil sensitivity profiles to be acquired by employing a calibration pulse sequence within the delay time of an inversion recovery pulse sequence. The calibration pulse sequence includes a constrained number of calibration pulses having small flip angles so that acceptable longitudinal magnetization recovery is provided.

14 Claims, 7 Drawing Sheets

SYSTEM AND METHOD FOR EMBEDDED SELF-CALIBRATION WITHIN AN INVERSION RECOVERY PULSE SEQUENCE

CROSS-REFERENCE TO RELATED APPLICATIONS

This application is based on provisional application Ser. No. 61/145,929, filed Jan. 20, 2009, and entitled "METHOD FOR MRI IMAGING USING AN INVERSION RECOVERY WITH AN SELF-CALIBRATION," and claims the benefit thereof.

STATEMENT REGARDING FEDERALLY SPONSORED RESEARCH

This invention was made with government support under EB000212 awarded by the National Institutes of Health. The government has certain rights in this invention.

BACKGROUND OF THE INVENTION

The field of the invention is magnetic resonance imaging ("MRI") methods and systems. More particularly, the invention relates to improving net acceleration when performing parallel imaging using inversion recovery pulse sequences.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

Depending on the technique used, many MR scans currently used to produce medical images require many minutes to acquire the necessary data. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel imaging." Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils. Thus the use of multiple receiver coils acts to multiply imaging speed, without increasing gradient switching rates or RF power.

Two categories of such parallel imaging techniques that have been developed and applied to in vivo imaging are SENSE (SENSitivity Encoding) and SMASH (SiMultaneous Acquisition of Spatial Harmonics). With SENSE, the undersampled k-space data is first Fourier transformed to produce an aliased image from each coil, and then the aliased image signals are unfolded by a linear transformation of the superimposed pixel values. With SMASH, the omitted k-space lines are filled in or reconstructed prior to Fourier transformation, by constructing a weighted combination of neighboring lines acquired by the different receiver coils. Both SENSE and SMASH require that the spatial sensitivity of the coils be determined, and one way to do so is by "autocalibration" that entails the use of variable density k-space sampling.

A more recent advance to SMASH techniques using autocalibration is a technique known as GRAPPA (GeneRalized Autocalibrating Partially Parallel Acquisitions), introduced by Griswold et al. This technique is described in U.S. Pat. No. 6,841,998 as well as in the article titled "Generalized Autocalibrating Partially Parallel Acquisitions (GRAPPA)," by Griswold et al. and published in *Magnetic Resonance in Medicine* 47:1202-1210 (2002). Using these GRAPPA techniques, lines near the center of k-space are sampled at the Nyquist frequency (in comparison to the greater spaced lines at the edges of k-space). These so-called autocalibration signal (ACS) lines are then used to determine the weighting factors that are used to reconstruct the missing k-space lines. In particular, a linear combination of individual coil data is used to create the missing lines of k-space. The coefficients for the combination are determined by fitting the acquired data to the more highly sampled data near the center of k-space.

When performing parallel imaging it is typically necessary to determine the sensitivity profiles of receiver coils. Traditionally this is done by one of two methods. First, a separate calibration scan can be performed, but this reduces the overall efficiency of an MRI examination because the time gains achieved by the parallel imaging process are offset by the addition of the calibration scan. Second, a self-calibration process can be performed. In this case, the data necessary to perform self-calibration is acquired by fully sampling data from a central region of otherwise undersampled k-space, which extends or repeats the imaging pulse sequences. For example, in FIG. 1a, an imaging process using traditional self-calibration begins at process block 2 with the acquisition of image data using parallel imaging techniques. This image acquisition process is performed by applying an imaging pulse sequence. At process block 4, calibration data is acquired by extending the imaging pulse sequence or by performing additional repetitions of the imaging pulse sequence. Following data acquisition, at process block 6, coil sensitivity profiles are generated using the calibration data and employed to perform image reconstruction at process block 8. In such a scan, the portion of acquisition time devoted to acquiring calibration data can be substantial and result in significantly reduced net acceleration. The reduction of net acceleration is especially prevalent at high acceleration factors and partially defeats the purpose of performing parallel imaging.

The reduction in net acceleration with traditional self-calibration methods can be modeled by considering a 3DFT acquisition with acceleration applied along two phase encoding directions, $k_y$ and $k_z$, where the corners of $k_y$-space and $k_z$-space are not sampled so as to provide isotropic resolution in the y-z plane. This acquisition would include $\pi N^2/4R$ phase encodes, where R is a nominal undersampling factor that is the product of the undersampling factors in the two phase encoding directions, that is, $R=R_y*R_z$. A similar, unaccelerated scan would include $\pi N^2/4$ phase encodes. If data necessary for self-calibration is acquired, then a central region of k-space is further sampled. Therefore, the total number of phase encodes (A) required for calibration is described by the following function:

$$A = \frac{\pi r_c^2 N^2}{4} + \left(\frac{\pi N^2}{4R} - \frac{\pi r_c^2 N^2}{4R}\right) = \frac{\pi N^2}{4R}(1 + r_c^2(R-1)); \qquad \text{Eqn. 1}$$

where $r_c$ defines the fraction of k-space radius acquired for performing calibration. From this equation it possible to determine that the net acceleration ($R_{net}$), which equals the number of phase encodes in an accelerated scan versus an unaccelerated scan, is $R/(1+r_c^2(R-1))$. As shown in FIG. 1*b*, this can lead to large differences between the net acceleration factor, which is actually attained, and the nominal acceleration factor.

It would therefore be desirable to develop systems and methods for acquiring the data necessary for calibration without reducing the net acceleration factor or adding to the overall scanning time.

SUMMARY OF THE INVENTION

The present invention overcomes the limitations of traditional calibration methods by providing a method for producing images with an MRI system that includes repeatedly performing an inversion recovery pulse sequence including a delay time (TD) to acquire image data using accelerated imaging and a calibration pulse sequence, which is embedded in the TD of the inversion recovery pulse sequence, to acquire calibration data using unaccelerated imaging until a desired amount of image data and calibration data is acquired. The method further includes generating a plurality of coil sensitivity profiles from the acquired calibration data and reconstructing an image using the acquired image data and the coil sensitivity profiles.

Various other features of the present invention will be made apparent from the following detailed description and the drawings.

BRIEF DESCRIPTION OF THE DRAWINGS

The invention will hereafter be described with reference to the accompanying drawings, wherein like reference numerals denote like elements, and.

DETAILED DESCRIPTION OF THE INVENTION

Figure 1A:
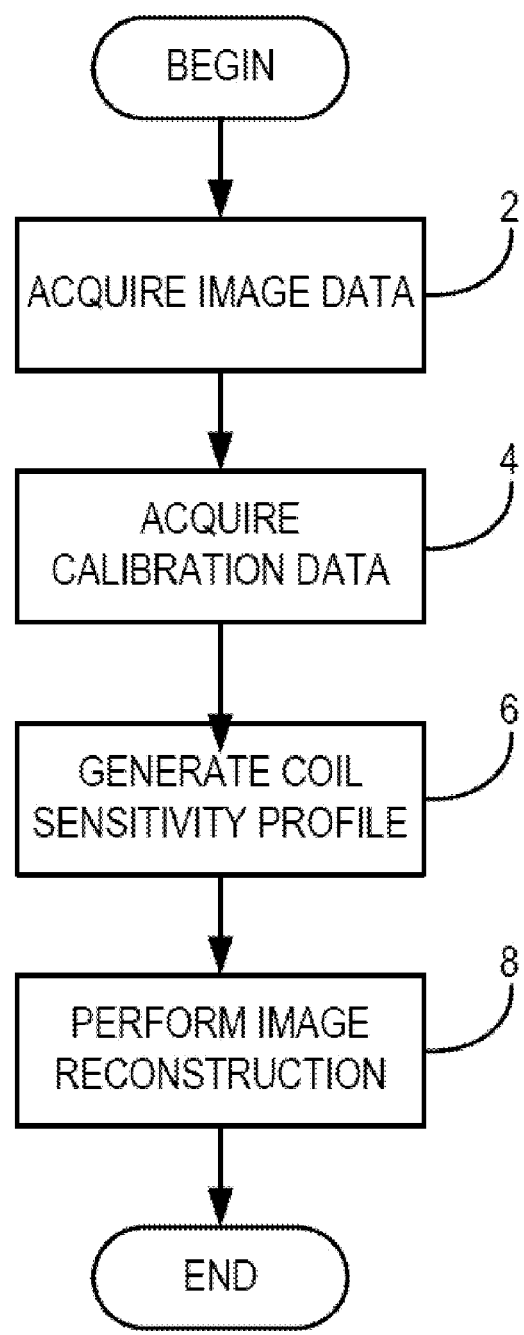
FIG. 1*a* is a flowchart setting forth the steps in performing imaging using traditional self-calibration.
Figure 1B:
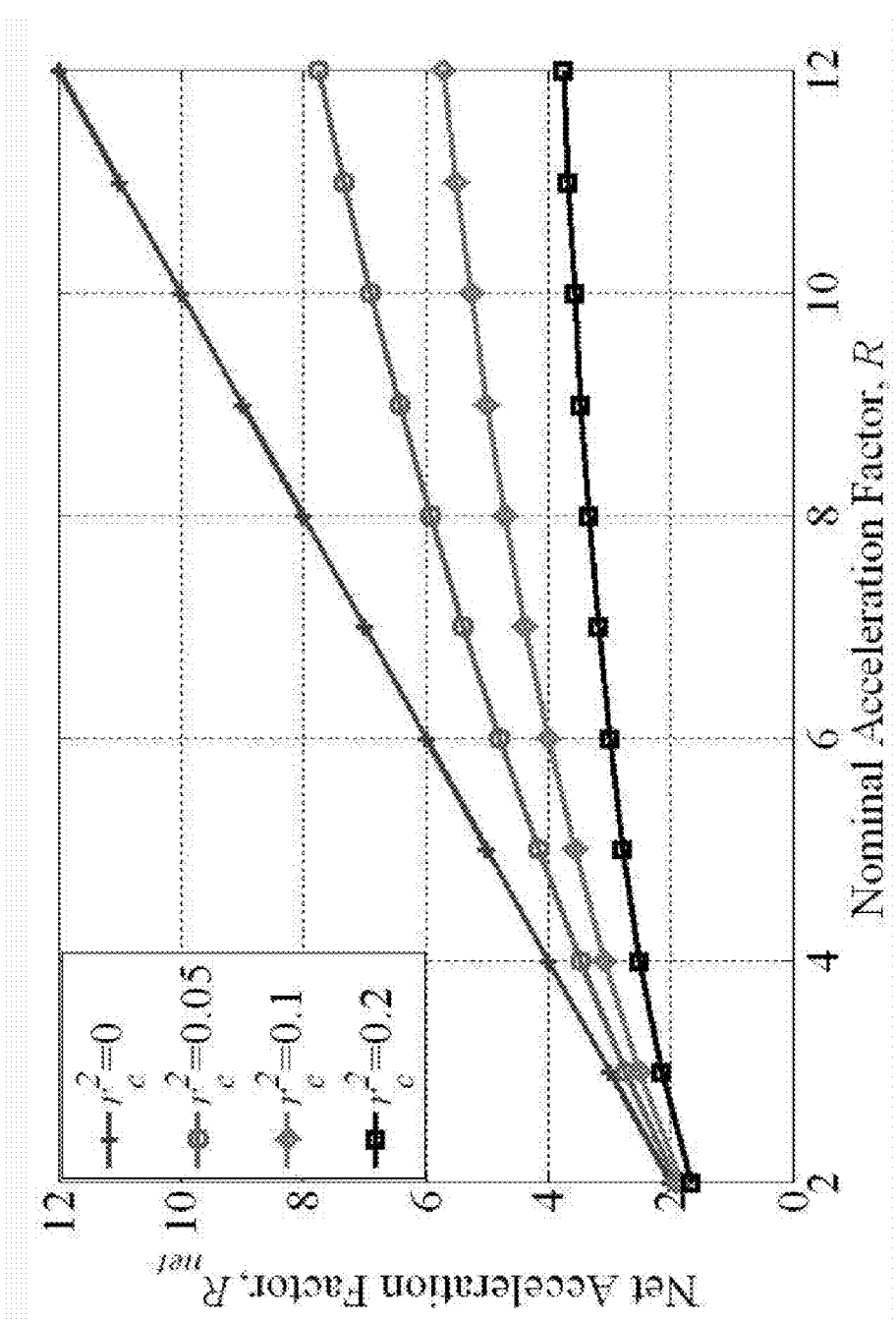
FIG. 1*b* is a graph illustrating the relationship between the nominal acceleration factor (R) and the net acceleration factor ($R_{net}$)
Figure 2:
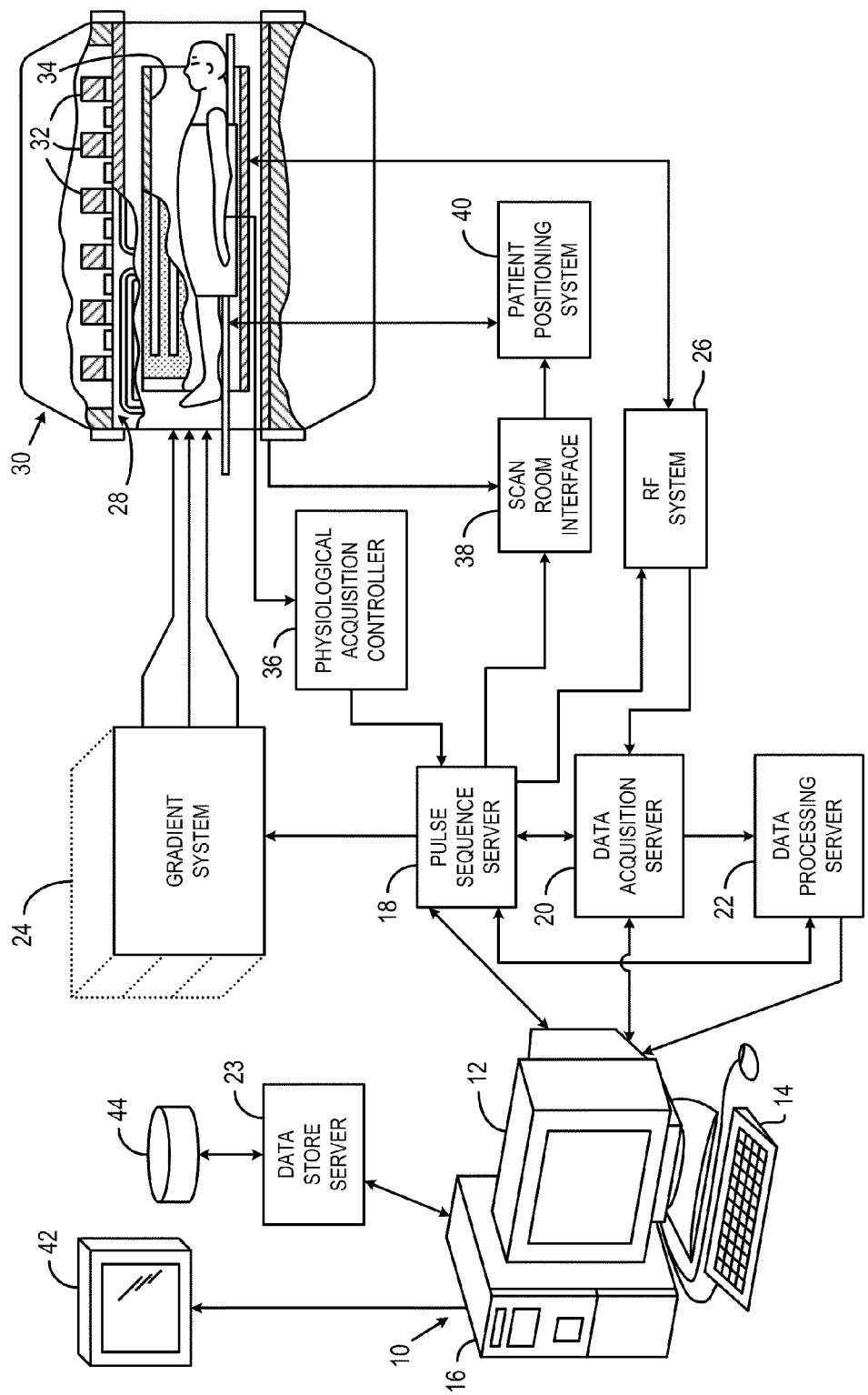
FIG. 2 is a block diagram of an MRI system that employs the present invention.

Referring to FIG. 2, the present invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 2) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 2).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 3:
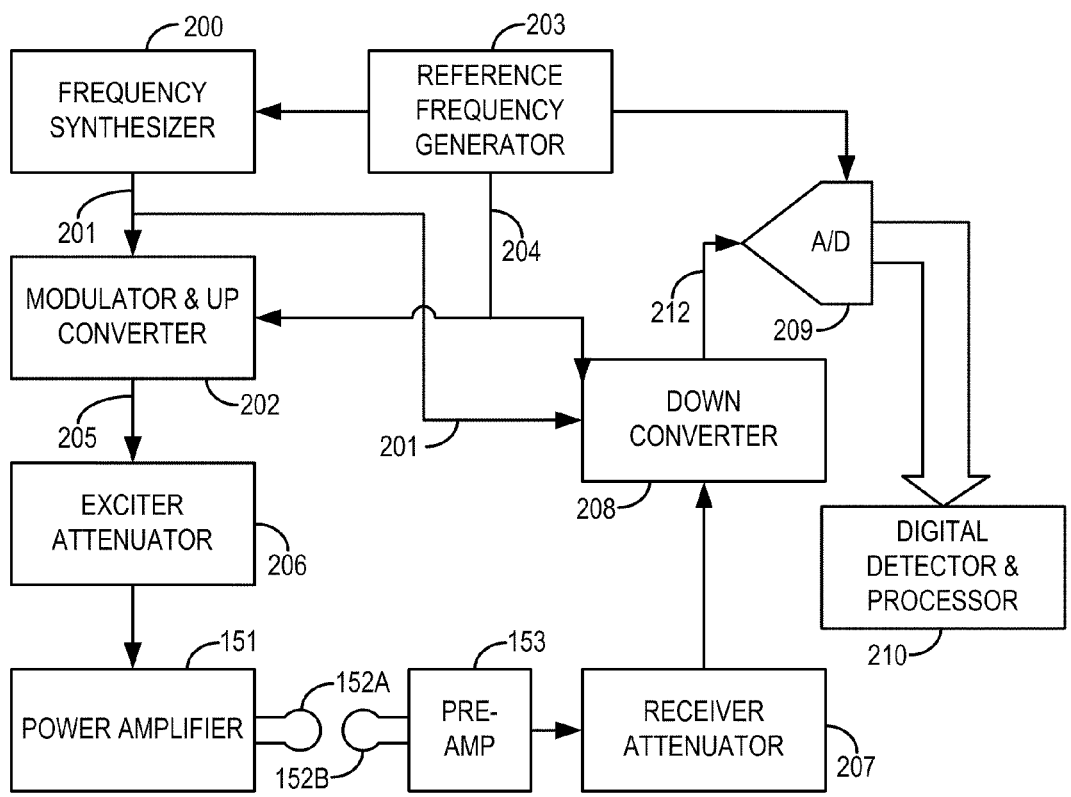
FIG. 3 is a block diagram of an RF system that forms part of the MRI system of FIG. 1.

As shown in FIG. 3, the RF system 26 may be connected to the whole body RF coil 34, or as shown in FIG. 3, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Referring particularly to FIG. 3, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A.

Referring still to FIG. 3 the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 that first mixes the MR signal with the carrier signal on line 201 and then mixes the resulting difference signal with a reference signal on line 204. The down converted MR signal is applied to the input of an analog-to-digital (A/D) converter 209 that samples and digitizes the analog signal and applies it to a digital detector and signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203.

Figure 4:
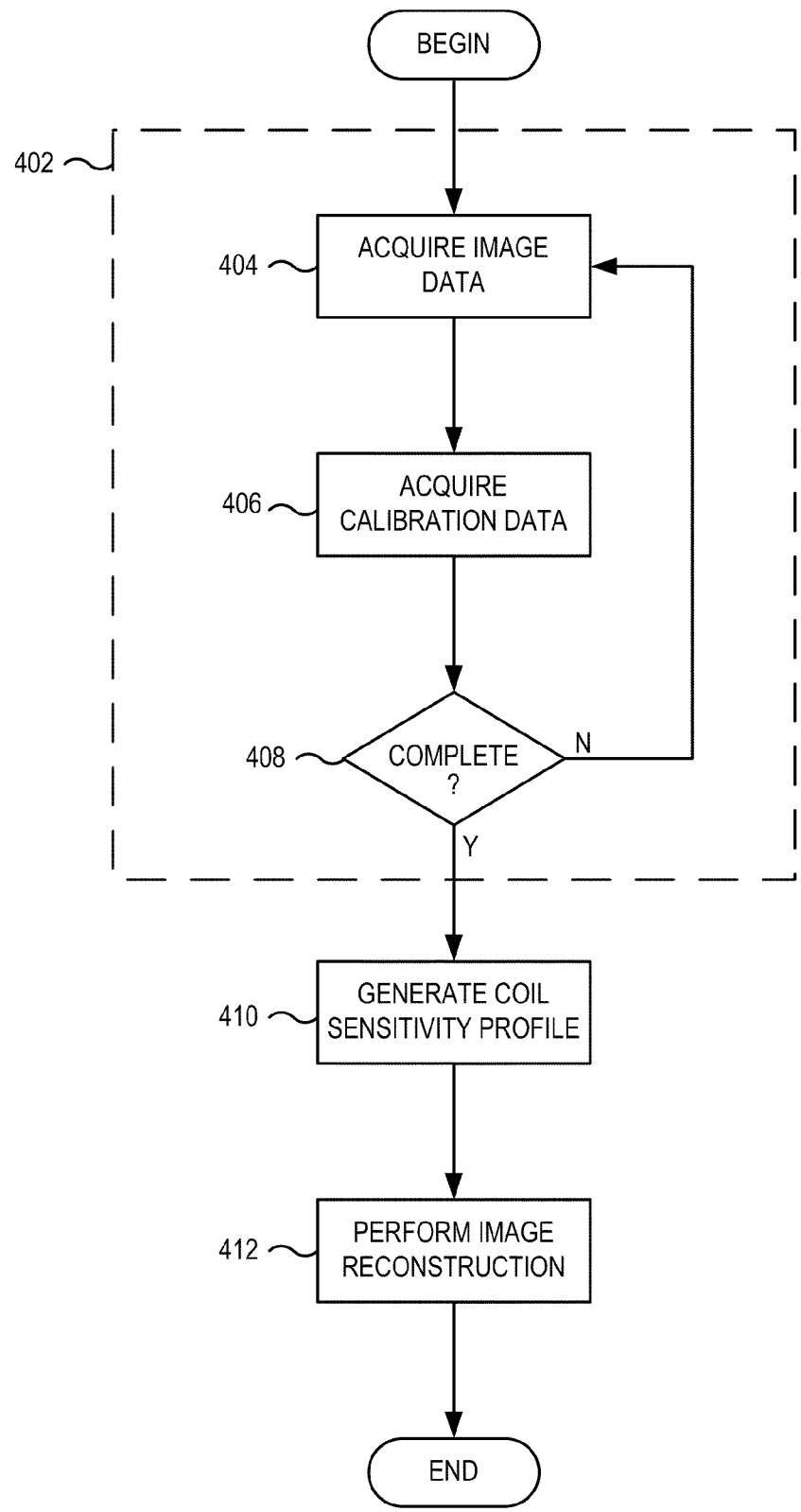
FIG. 4 is a flowchart setting forth the steps for a method in accordance with the present invention.

Referring to FIG. 4, an imaging method in accordance with the present invention begins with a hybrid image-data/calibration-data acquisition process that is generally designated in box 402. The hybrid image-data/calibration-data acquisition process 402 includes a step of acquiring image data, as indicated at process block 404, and thereafter a step of acquiring calibration data, as indicated at process block 406. The hybrid image-data/calibration-data acquisition process 402 is performed by applying an inversion recovery with embedded self-calibration (IRES) pulse sequence that includes an inversion recovery pulse sequence, which generally controls the image data acquisition process 404, and a self-calibration pulse sequence, which generally controls the calibration data acquisition process 406. One exemplary type of an inversion recovery pulse sequence is a Magnetization Prepared RApid Gradient Echo (MP-RAGE) pulse sequence, which is often used in high-resolution, T1-weighted, 3D brain acquisitions. However, many other imaging pulse sequences are contemplated and readily suitable for use with the present invention. The image data acquisition process 404 and calibration data acquisition process 406 are repeated until, at decision block 408, it has been determined that a sufficient amount of image data and calibration data has been acquired. Thus, if a sufficient amount of image data and calibration data has not been acquired, image data acquisition 404 and calibration data acquisition 406 are repeated. Else, the process continues as follows.

At process block 410, the acquired calibration data is used to generate coil sensitivity maps that are subsequently employed at process block 412 to perform image reconstruction. The IRES pulse sequence advantageously decouples the acquisition of calibration data from the reconstruction technique and, thus, a variety of image reconstruction methods may be employed. For example, images acquired in accordance with IRES methods may undergo parallel reconstruction using either GRAPPA or SENSE. Compared to an MP-RAGE sequence using traditional self-calibration and for nominal accelerations between four and six, it has been shown that an IRES sequence using MP-RAGE provides improved signal-to-noise ratio (SNR) at fixed acquisition times or comparable SNRs at reduced acquisition times. However, because IRES acquires image data and calibration separately, scans employing IRES do not benefit from the incremental SNR improvements provided by such points compared to standard self-calibrated GRAPPA.

Figure 5:
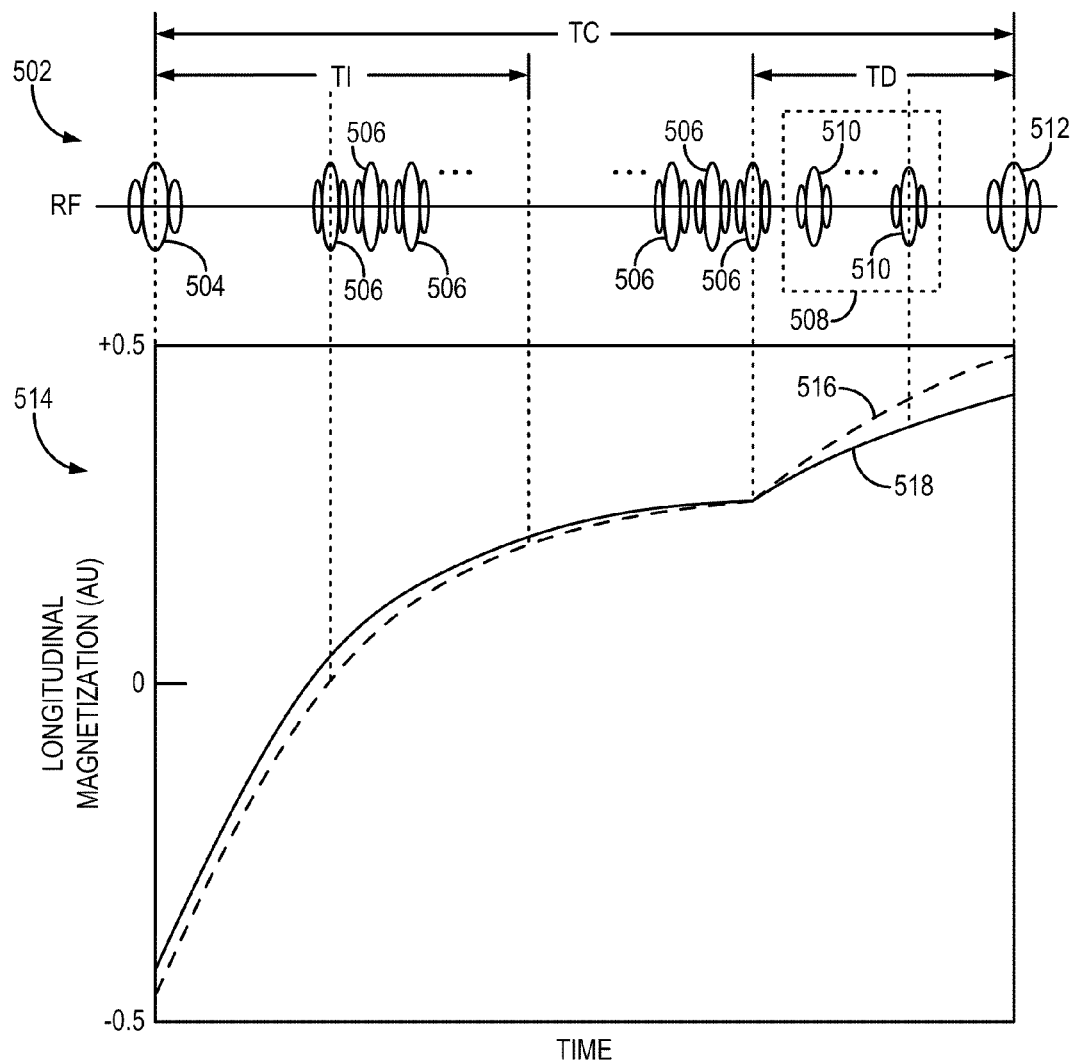
FIG. 5 is a graphical representation of a pulse sequence in accordance with the present invention and an associated graph of longitudinal magnetization versus time across the pulse sequence.

Referring now to FIG. 5, one implementation of an IRES pulse sequence using MP-RAGE is indicated generally at 502 and includes an inversion time (TI), delay time (TD), and overall cycle time (TC). This IRES sequence 502 further includes an 180 degree inversion pulse 504 and data acquisition using gradient recalled echo (GRE) pulses 506, which have a flip angle $\alpha$ and are repeated $n_R$ times in a cycle. The time period between repeating GRE pulses 506 is referred to as the repetition time (TR). These parameters (i.e., TI, TD, TC, TR, $\alpha$, and $n_R$) are defined based on scan objectives. For example, for brain imaging they may be chosen to minimize cerebral-spinal-fluid (CSF) signal and maximize the contrast between white matter (WM) and gray matter (GM). The IRES pulse sequence 502 may be repeated $n_c$ times until all desired acquisitions are made. Therefore, the number of phase encodes (A) is the product of $n_R$ and $n_c$.

An IRES sequence further includes a self-calibration pulse sequence that is embedded within the TD of the inversion recovery sequence. For example, the IRES sequence using the MP-RAGE pulse sequence 502 includes a self-calibration sequence 508 that employs $n_B$ calibration pulses 510 having a flip angle ($\beta$) that is embedded within the TD of the MP-RAGE sequence. This allows the calibration data to be acquired in the time period during which magnetization is allowed to recover prior to the next inversion pulse 512.

Referring still to FIG. 5, the introduction of the self-calibration pulses 510 introduces perturbation and reduces the degree of longitudinal magnetization recovery during the TD interval. This is shown schematically at 514 where the longitudinal magnetization of a traditional MP-RAGE sequence 516 is compared to the magnetization recovery of a IRES sequence using MP-RAGE 518 and where both sequences employ the same number of GRE pulses 506. Reduced longitudinal recovery can reduce signal strength and contrast in an overall IRES sequence. This effect is significantly reduced by using self-calibration pulses 510 with small flip angles, as the calibration map can have a low spatial resolution. It is noted that the flip angle may be varied substantially, with the trade off that the TD interval may need to be extended to allow for the recovery of longitudinal magnetization. However, the present invention has found that flip angles less than or equal to approximately four degrees (i.e. $\beta \leq 4$ degrees) will allow self-calibration and the recovery of longitudinal magnetization without a need to extend the TD interval. Therefore, generally, the calibration pulse sequence 508 may be constrained so that $n_B$ multiplied by the time period between the calibration pulses ($TR_B$) is less than TD, that is, $(n_B * TR_B) \leq$ TD. For example, in a pulse sequence having TR=6.4 ms and TD=670 ms, the maximum $n_B$ is limited to 100.

Figure 6:
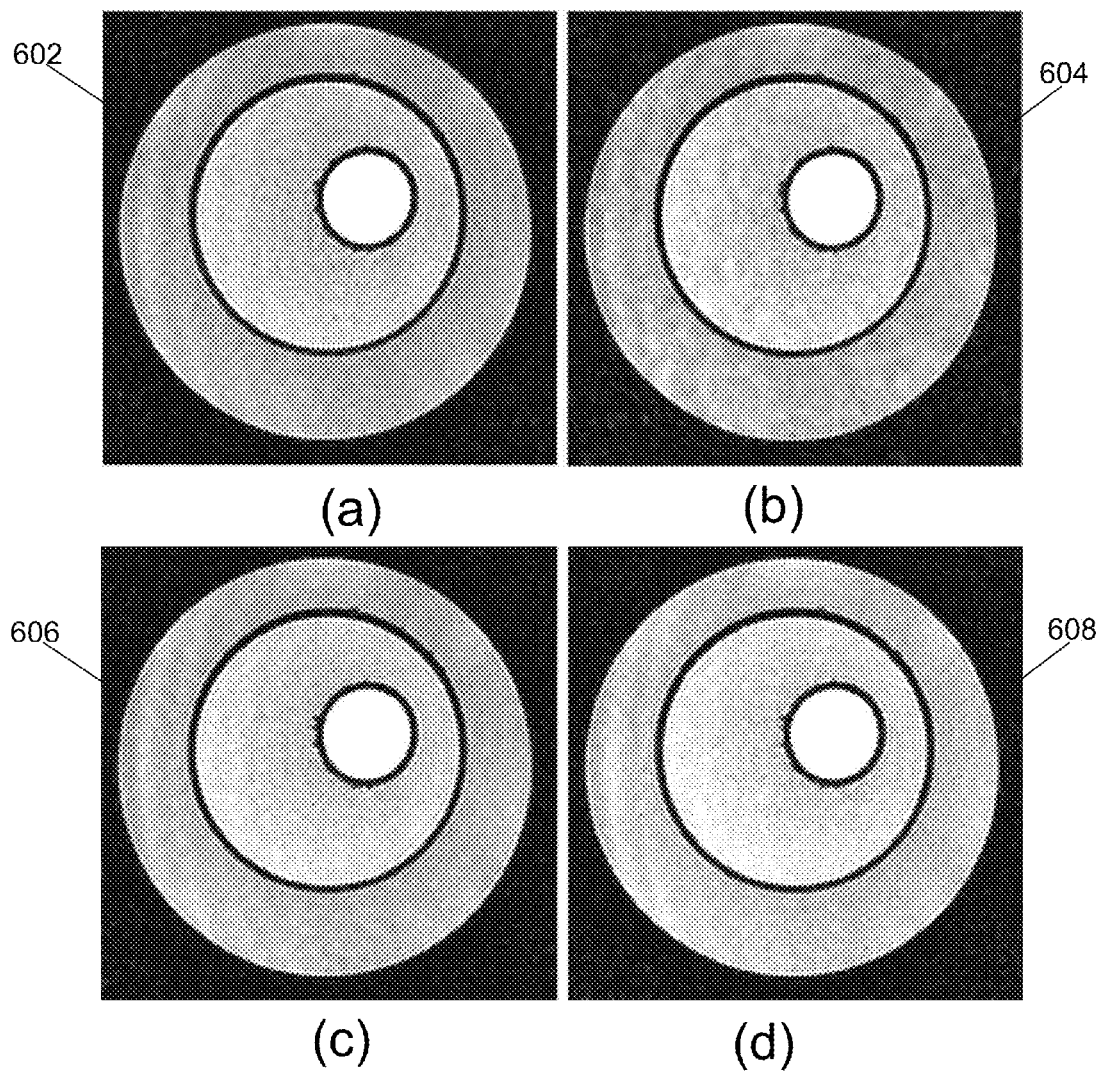
FIG. 6 is a set of images acquired in accordance with the present invention.

Referring now to FIG. 6, an image acquired using a MP-RAGE pulse sequence with traditional self-calibration 602 is compared to images acquired with IRES sequences using MP-RAGE with $\beta$=1 degree, $\beta$=4 degrees, and $\beta$=8 degrees at 604, 606, and 608 respectively. Both the traditional self-calibrating MP-RAGE sequence and the IRES sequence are optimized for high-resolution, T1-weighted brain imaging and include the following parameters: a constant GRE pulse flip angle of $\alpha$=8 degrees, TC=2300 ms, TI=900 ms, TR=6.4 ms for both the imaging and self-calibration pulses, and an echo time of TE=2.8 ms. The sequence further includes a bandwidth of ±31.25 kHz, a field of view (FOV) in the x-direction of $FOV_x$=26 cm, $FOV_y$=24 cm, $N_x$=256, $N_y$=240, $N_z$=204, and a 1.00 mm$^3$ isotropic resolution. The number of alpha pulses per cycle is set to $n_R$=170, with small variations in different acceleration configurations that result from rounding off the number of cycles. Additionally, the corners of $k_y$-$k_z$-space are excluded from sampling and a recessed-elliptical centric view order is imposed so that ghosting and flow artifacts are reduced and isotropic k-space modulation is provided in the phase-encoding plane.

Again, it is noted that the present invention is not limited to pulse sequences using MP-RAGE. A variety of inversion pulses may be used so long as they include an appropriately long TD. For example, non-contrast magnetic resonance angiography (MRA) may be performed using IRES methods where the TI is chosen to allow for inflow and subtraction and the nominal acceleration factor is approximately three. While IRES may be used with a variety of acceleration factors, it provides more significant improvements in SNR or net acceleration at higher R values.

Again, it is noted that the present invention is not limited to pulse sequences using MP-RAGE. The method is applicable to any pulse sequence in which an appropriately long TD interval is included after readout of the imaging data which is solely used for recovery of magnetization. For example, inversion-recovery-based non-contrast magnetic resonance angiography (MRA) may be performed using IRES methods. This can be done with a dual acquisition approach in which the TI is chosen to allow for inflow of blood into the imaging region. In one acquisition the inversion slab encompasses the imaging slab and an outer volume while in the other it is selective for the imaging slab only. Subtraction of the two yields an image in which the vasculature of the inflowing blood is isolated. IRES can be used during the TD interval of both acquisitions. Another example is T1- or T2-weighted inversion-recovery-based fast spin echo (FSE) imaging, which is similar to MP-RAGE except that multiple RF-focused spin-echo readouts are used. While IRES may be used with a variety of acceleration factors, it provides more significant improvements in SNR or net acceleration at R values higher than about two or three.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

The invention claimed is:

1. A method for producing images with a magnetic resonance imaging (MRI) system, the steps comprising:
    a) performing, with the MRI system, an inversion recovery pulse sequence including a delay time (TD) to acquire image data using accelerated imaging;
    b) performing, with the MRI system, a calibration pulse sequence to acquire calibration data using unaccelerated imaging, wherein the calibration pulse sequence is embedded within the TD of the inversion recovery pulse sequence;
    c) repeating, with the MRI system, steps a) and b) a plurality of times until a desired amount of image data and calibration data is acquired;

d) generating a plurality of coil sensitivity profiles from the acquired calibration data; and e) reconstructing an image using the acquired image data and the sensitivity profiles produced in step d).

2. The method as recited in claim 1 wherein step b) further includes employing a series of calibration pulses having a selected flip angle.

3. The method as recited in claim 2 wherein the selected flip angle is less than five degrees.

4. The method as recited in claim 3 wherein the number of calibration pulses is constrained so that the number of calibration pulses multiplied by the repetition time between calibration pulses is less than the TD of the inversion recovery pulse sequence.

5. The method as recited in claim 1 wherein the inversion recovery pulse sequence of step a) is a magnetization prepared rapid gradient echo (MP-RAGE) pulse sequence.

6. The method as recited in claim 1 wherein the inversion recovery pulse sequence of step a) is a non-contrast magnetic resonance angiography pulse (MRA) pulse sequence.

7. The method as recited in claim 1 wherein the inversion recovery pulse sequence of step a) uses an inversion time selected to null cerebrospinal fluid.

8. A magnetic resonance imaging system comprising:

a magnet system configured to generate a polarizing magnetic field about at least a portion of a subject arranged in the MRI system;

a plurality of gradient coils configured to apply a gradient field to the polarizing magnetic field;

a radio frequency (RF) system configured to apply an excitation field to the subject and acquire MR image data therefrom;

a computer system programmed to:
  perform an inversion recovery pulse sequence including a delay time (TD) to acquire image data using accelerated imaging;
  perform a calibration pulse sequence to acquire calibration data using unaccelerated imaging, wherein the calibration pulse sequence is embedded within the TD of the inversion recovery pulse sequence;
  generate a plurality of coil sensitivity profiles from the acquired calibration data; and
  reconstructing an image using the acquired image data and the sensitivity profiles.

9. The system as recited in claim 8 wherein the computer system is further programmed to employing a series of calibration pulses having a selected flip angle to perform the calibration pulse sequence.

10. The system as recited in claim 9 wherein the selected flip angle is less than five degrees.

11. The system as recited in claim 10 wherein the computer system is further programmed to constrain the number of calibration pulses so that the number of calibration pulses multiplied by the repetition time between calibration pulses is less than the TD of the inversion recovery pulse sequence.

12. The system as recited in claim 8 wherein the computer system is further programmed to perform a magnetization prepared rapid gradient echo (MP-RAGE) pulse sequence as part of the inversion recovery pulse sequence.

13. The system as recited in claim 8 wherein the computer system is further programmed to perform a non-contrast magnetic resonance angiography pulse (MRA) pulse sequence as part of the inversion recovery pulse sequence.

14. The system as recited in claim 8 wherein the computer system is further programmed to use an inversion time selected to null cerebrospinal fluid when performing the inversion recovery pulse sequence.

\* \* \* \* \*